(12) United States Patent
Jestin et al.

(10) Patent No.: US 10,177,525 B2
(45) Date of Patent: Jan. 8, 2019

(54) PASSIVE MODE-LOCKED LASER SYSTEM AND METHOD FOR GENERATION OF LONG PULSES

(71) Applicant: INSTITUT NATIONAL DE LA RECHERCHE SCIENTIFIQUE, Quebec (CA)

(72) Inventors: Yoann Jestin, Montreal (CA); Roberto Morandotti, Montreal (CA); Michael Kues, Montreal (CA); Benjamin Wetzel, Montreal (CA); Christian Reimer, Longueuil (CA); Piotr Roztocki, Montreal (CA)

(73) Assignee: INSTITUT NATIONAL DE LA RECHERCHE SCIENTIFIQUE, Québec (CA)

( * ) Notice: Subject to any disclaimer, the term of this patent is extended or adjusted under 35 U.S.C. 154(b) by 0 days.

(21) Appl. No.: 15/551,709

(22) PCT Filed: Mar. 15, 2016

(86) PCT No.: PCT/CA2016/050282
§ 371 (c)(1),
(2) Date: Aug. 17, 2017

(87) PCT Pub. No.: WO2016/145523
PCT Pub. Date: Sep. 22, 2016

(65) Prior Publication Data
US 2018/0069369 A1 Mar. 8, 2018

Related U.S. Application Data

(60) Provisional application No. 62/135,370, filed on Mar. 19, 2015.

(51) Int. Cl.
*H01S 3/11* (2006.01)
*H01S 3/067* (2006.01)
(Continued)

(52) U.S. Cl.
CPC ........ *H01S 3/1115* (2013.01); *G02B 6/29338* (2013.01); *G02B 6/29341* (2013.01);
(Continued)

(58) Field of Classification Search
CPC .............. H01S 3/1115; H01S 3/06791; H01S 3/06725; H01S 3/06754; H01S 3/08; H01S 3/08018; H01S 3/08031
See application file for complete search history.

(56) References Cited

U.S. PATENT DOCUMENTS 5,050,183 A 9/1991 Duling, III
5,365,531 A 11/1994 Lin et al.
(Continued)

FOREIGN PATENT DOCUMENTS

CA 2761804 6/2013

OTHER PUBLICATIONS

Office Action issued by U.S. Appl. No. 15/552,061, dated Jan. 2, 2018.
(Continued)

*Primary Examiner* — Armando Rodriguez
(74) *Attorney, Agent, or Firm* — Gwendoline Bruneau

(57) ABSTRACT

A passive mode-locked laser method and system, the system comprising a nonlinear optical loop comprising a resonant nonlinear element, coupled to an amplification section by a beam splitter, the beam splitter splitting a light beam from the amplification section into light beams propagating in opposite directions around the nonlinear optical loop, the resonant nonlinear element acting as both a nonlinear element and a narrow bandwidth filter for the laser system, allowing mode-locking operation of the system on a single resonance of the resonant nonlinear element.

19 Claims, 5 Drawing Sheets

(51) Int. Cl.
    G02B 6/293    (2006.01)
    H01S 3/108    (2006.01)
    H01S 5/14     (2006.01)
    H01S 3/00     (2006.01)
(52) U.S. Cl.
    CPC .......... H01S 3/06791 (2013.01); H01S 3/108
        (2013.01); H01S 3/1083 (2013.01); H01S
        3/1109 (2013.01); H01S 3/1112 (2013.01);
        H01S 5/14 (2013.01); H01S 3/0078 (2013.01);
                                H01S 3/06754 (2013.01)

(56)             References Cited

U.S. PATENT DOCUMENTS 5,812,567  A     9/1998  Jeon et al.
    5,898,716  A *   4/1999  Ahn .................... H01S 3/06791
                                                            372/18
    6,897,434  B1    5/2005  Kumar et al.
    7,817,684  B2   10/2010  Nicholson
    8,014,428  B2    9/2011  Fleming et al.
    8,222,623  B2    7/2012  Trojek et al.
    2011/0142088 A1  6/2011  Winkelnkemper et al.
    2015/0071322 A1  3/2015  Haensel

OTHER PUBLICATIONS

Bonneau, D., Silverstone, J. W., Thompson, M. G., "Silicon quantum photonics", in Silicon Photonics III, L. Pavesi, D. J. Lockwood, Eds. (Springer, ed. 3, 2016), pp. 41-82.
Caspani, Lucia et al, "Integrated source of multiplexed photon pairs", Optical Society of America, CLEO:2014.
Crowell, M. H., "Characteristics of mode-coupled lasers", IEEE J. Quantum Electron. 1, 12 (1965).
Dong et al., "Energy-time entanglement generation in optical fibers under CW pumping", Opt. Express 22, 359 (2014).
Duling, I. N. III, "Subpicosecond all-fiber erbium laser", Electron. Lett. 27, 544-545 (1991).
Grassani, D. et al., "Micrometer-scale integrated silicon source of time-energy entangled photons", Optica 2, 88 (2015).
Grudinin, A. B. et al., "Energy quantization in figure eight fiber laser", Electron. Lett. 28, 67-68 (1992).
Hargrove, L. E., Fork, R. L., and Pollack, M. A., "Locking of He—Ne laser modes induced by synchronous intracavity modulation", Appl. Phys. Lett. 5, 4 (1964).
Haus, H.A. et al., "Additive-pulse modelocking in fiber lasers", Quant. Electron., IEEE J. of 30, 200-208 (1994).
Ippen, E. P., "Principles of passive mode locking", Appl. Phys. B 58, 159-170 (1994).
Kimble, H. J., "The quantum internet", Nature 453, 1023 (2008).
Kippenberg, T. et al., "Mircroresonator-based optical frequency combs", Science 332, 555-559 (2011).
Kolobov, M., "The spatial behavior of nonclassical light", Rev. Mod. Phys. 71, 1539 (1999).
Komarov, A. et al., "Multistability and hysteresis phenomena in passively mode-locked fiber lasers", Phys. Rev. A 71, 053809 (2005).
Kwiat et al., "New high-intensity source of polarization-entangled photon paris", Phys. Rev. Lett. 75, 4337 (1995).
Li et al., "Optical-Fiber Source of Polarization-Entangled Photons in the 1550 nm Telecom Band", Phys. Rev. Lett. 94, 0353601 (2005).

Matsas, V. J. et al., "Selfstarting passively mode-locked fiber ring soliton laser exploring nonlinear polarization rotation", Electron. Lett. 28, 1391-1393 (1992).
Min, S. et al., "Semiconductor optical amplifier based high duty-cycle, self-starting figure-eight 1.7GHz laser source", Opt. Express 17, 6187 (2009).
Moss, D. J. et al., "New CMOS-compatible platforms based on silicon nitride and Hydex for nonlinear optics", Nat. Phot. 7, 597-607 (2013).
Newbury, Nathan R., Swann, William C., "Low-noise fiber-laser frequency combs (Invited)", J., Opt. Soc. Am. B/vol. 24, No. 8, Aug. 2007.
Olislager et al., "Silicon-on-insulator integrated source of polarization-entangled photons", Opt. Lett. 38, 1960 (2013).
Peccianti, M. et al., "Demonstration of a stable ultrafast laser based on a nonlinear microcavity", Nat. Commun. 3, 765 (2012).
Razzari, L. et al., "CMOS-compatible integrated optical hyper-parametric oscillator", Nat. Phot. 4, 41-45 (2010).
Reimer, C. et al., "Integrated frequency comb source of heralded single photons", Opt. Express 22, 6535-6546 (2014).
Reimer, C. et al., "Cross-polarized photon-pair generation and bi-chromatically pumped optical parametric oscillation on a chip", Nature Commun. 6, 8236 (2015).
Richardson, D. J. et al., "Selfstarting, passively modelocked erbium fiber laser based on the amplifying sagnac switch", Electron. Lett. 27, 542-544 (1991).
Soto-Crespo, J. M., Akhmediev, N. "Soliton as strange attractor: nonlinear synchronization and chaos", Phys. Rev. Lett. 95, 024101 (2005).
Spence, D. E. et al., "60-fsec pulse generation from a self-mode-locked Ti:sapphire laser", Opt. Lett. 16, 4244 (1991).
Spring et al., "On-chip low loss heralded source of pure single photons", Opt. Express 21, 13522 (2013).
Tager, A. A. et al. "Mode competition and mode locking in compound cavity semiconductor lasers", Photonics Tech. Lett., IEEE 6, 164-166 (1994).
Takesue et al., "Generation of polarization-entangled photon pairs and violation of Bell's inequality using spontaneous four-wave mixing in a fiber loop", Phys. Rev. A 70, 031802(R) (2004).
Takesue et al., "Entanglement generation using silicon wire waveguide", Appl Phys. Lett. 91, 201108 (2007).
Tang, D. Y. et al., "Mechanism of multisoliton formation and soliton energy quantization in passively mode-locked fiber lasers", Phys. Rev. A 72, 043816 (2005).
Wakabayashi et al., "Time-bin entangled photon pair generation from Si micro-ring resonator", Opt. Express 23, 1103 (2015).
Walther, P. et al., "Experimental one-way quantum computing", Nature 434, 169 (2005).
Wang, J.Y. et al., "Generation of optical waveforms in 1.3-μm SOA-based fiber laser", Laser Phys. 22, 216 (2012).
Weiner, A. M., "Principles of Mode-Locking, in Ultrafast Optics", John Wiley & Sons, Inc., Hoboken, NJ, USA (2009).
Yang, X. et al., "Sub-picosecond pulse generation employing an SOA-based nonlinear polarization switch in a ring cavity", Opt. Express 12, 2448 (2004).
Young-Kai, C. et al., "Monolithic colliding-pulse mode-locked quantum-well lasers", Quant. Elect., IEEE Journal of 28, 2176-2185 (1992).
Zhong, Y.H. et al., "Passively mode-locked fiber laser based on nonlinear optical loop mirror with semiconductor optical amplifier", Laser Phys. 20, 1756 (2010).

* cited by examiner

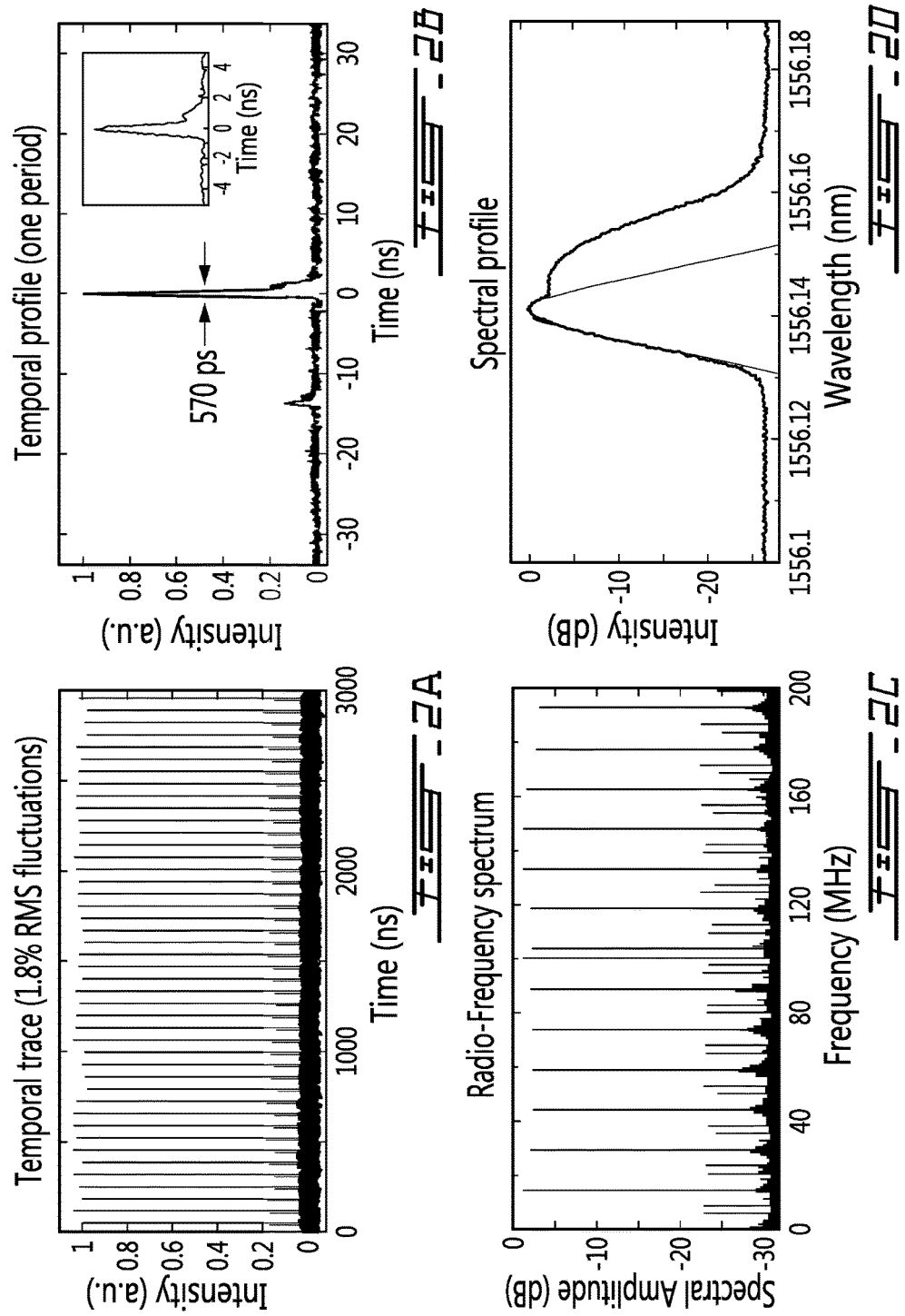

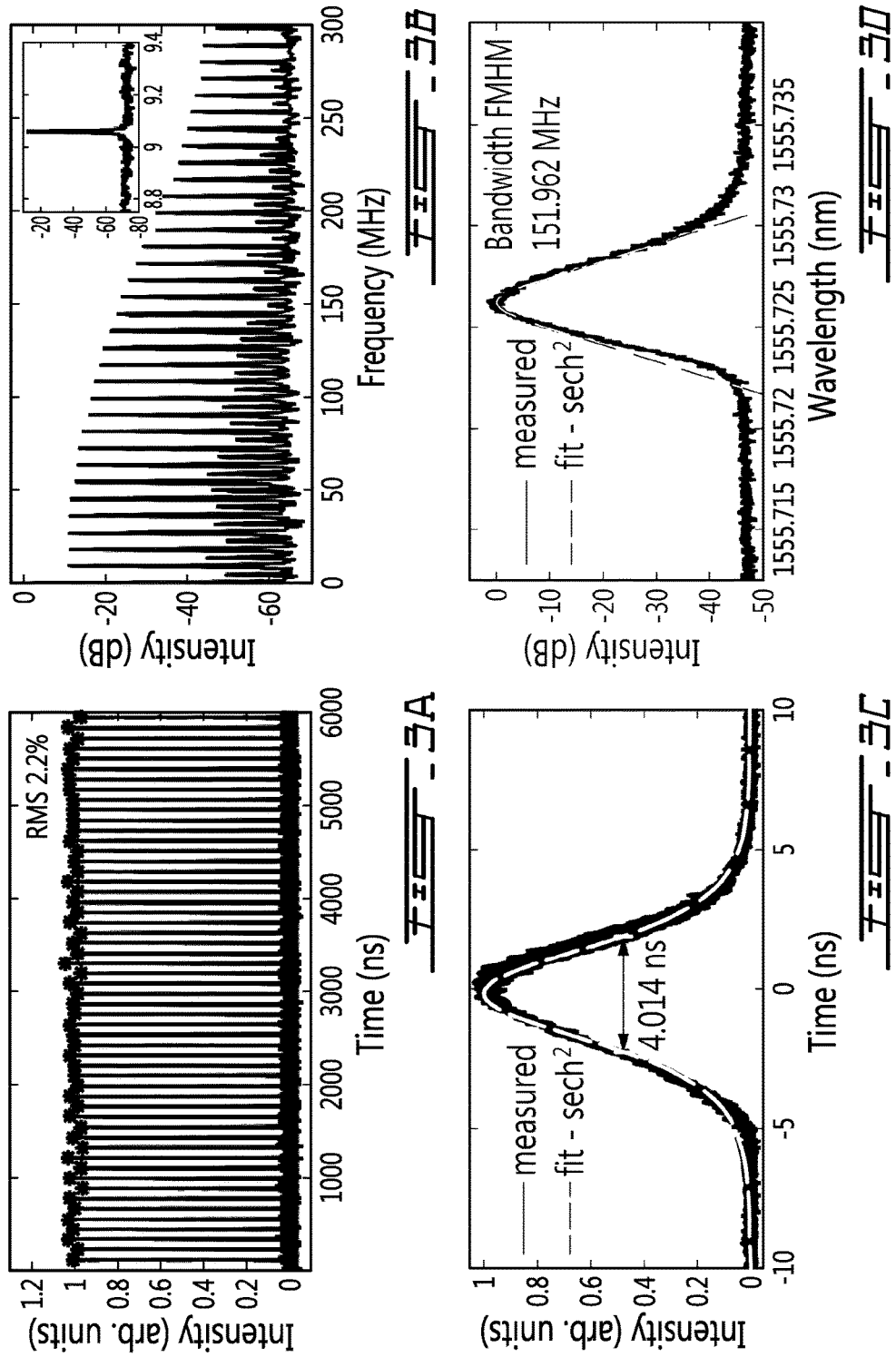

PASSIVE MODE-LOCKED LASER SYSTEM AND METHOD FOR GENERATION OF LONG PULSES

CROSS-REFERENCE TO RELATED APPLICATIONS

[0001.1] This application is a National Entry Application of PCT application no PCT/CA2016/050282 filed on Mar. 15, 2016 and published in English under PCT Article 21(2) as WO 2016/145523, which itself claims benefit of U.S. provisional application Ser. No. 62/135,370, filed on Mar. 19, 2015. All documents above are incorporated herein in their entirety by reference.

FIELD OF THE INVENTION

The present invention relates to mode-locked lasers. More specifically, the present invention is concerned with a passive mode-locked laser system and method.

BACKGROUND OF THE INVENTION

Mode-locked lasers form the foundation of a large number of applications ranging from telecommunications, spectroscopy and metrology to nonlinear optics. As active mode-locking is limited to electronic frequencies and involves a high degree of complexity, the ability to use passive mode-locking is desirable to reduce complexity and enable higher repetition rates. Monolithically integrated semiconductor lasers usually use semiconductor saturable absorbers (SESAMS) exploiting colliding pulse mode-locking [1] or compound cavity mode-locking methods [2] to generate short pulses in the femtosecond regime. Within the framework of fiber laser systems, while SESAMS can be used [3], nonlinear optical effects are usually exploited to artificially achieve passive mode-locking. Among these approaches, nonlinear amplifying loop mirrors (NALM) [4,5], nonlinear polarization rotation (NPR) [6,7], Kerr lenses [8], additive pulse mode-locking [9] or four-wave mixing [10] are commonly implemented.

Semiconductor optical amplifier-based laser exploiting nonlinear amplifying loop mirrors (NALM) have been presented [11, 12, 13], with the aim of reducing the input power and push forward integration. These systems usually have average optical powers between about 1 and 10 mW and emit strongly phase-modulated ("chirped") pulses with duration between about 0.5 ns and 10 ns.

However, there is no such laser system able to directly generate transform-limited pulses, i.e. pulses having a spectral width inversely proportional to the minimal pulse duration, which is highly important for multiplexing applications in telecommunication systems or optical interconnects for example.

Mode-locking based on nonlinear optical interactions such as nonlinear amplifying loop mirrors (NALM) or nonlinear polarization rotation (NPR) is intrinsically related to the nonlinear length of the element, proportional to the length of the element (L), its nonlinear coefficient (y) and the instantaneous optical power (P) in the element, i.e. a product of all three terms (L*·y·*P). As a result, the nonlinear interaction required to achieve passive mode-locking either relies on high optical powers, which are usually obtained through ultra-short pulses (50 fs-10 ps), or from nonlinear interaction over long distances within the element, intrinsically limiting the repetition rate of the laser source. Mode-locking of long bandwidth-limited pulses (>100 ps) finds broad demand in applications requiring both low pump powers and a high-degree of integration, and is very challenging to achieve considering standard passive mode-locking methods.

There is still a need in the art for a passive mode-locked laser system and method.

SUMMARY OF THE INVENTION

More specifically, in accordance with the present invention, there is provided a passive mode-locked laser system, comprising a nonlinear optical loop comprising a resonant nonlinear element, an amplification section, and an output coupler coupling optical pulses out of the laser system, wherein the nonlinear optical loop and the amplification section are coupled together by a beam splitter, the beam splitter splitting a light beam from the amplification section into light beams propagating in opposite directions around the nonlinear optical loop; the resonant nonlinear element acting as both a nonlinear element and a narrow bandwidth filter for the laser system, allowing mode-locking operation of the system on a single resonance of the resonant nonlinear element.

There is further provided a source of mode-locked pulses in a range between 0.1 ns and 10 ns, comprising a nonlinear resonant element embedded in one of: i) a nonlinear amplifying loop mirror and ii) an unbalanced nonlinear optical loop mirror.

There is further provided a method for generating passively mode-locked pulses in a range between 0.1 ns and 10 ns, comprising embedding a nonlinear resonant element in one of: i) a nonlinear amplifying loop mirror and ii) an unbalanced nonlinear optical loop mirror.

Other objects, advantages and features of the present invention will become more apparent upon reading of the following non-restrictive description of specific embodiments thereof, given by way of example only with reference to the accompanying drawings.

BRIEF DESCRIPTION OF THE DRAWINGS

In the appended drawings:

FIG. 2 show examples of the laser characteristics of the system of FIG. 1A with a cavity resonance bandwidth of 650 MHz: FIG. 2A: real-time temporal trace of the pulse train with RMS noise of 1.8%; FIG. 2B: radio-frequency (RF) spectrum of the mode-locked laser, showing clear and narrow peaks at the repetition rate of the laser (14.8 MHz); FIG. 2C: one period temporal trace obtained at the laser output and measured using an 8 GHz bandwidth real-time photodiode/oscilloscope system; and FIG. 2D: corresponding spectral profile measured with a high resolution Optical Spectrum Analyzer (OSA), fit obtained considering a hyperbolic secant (sech) pulse of 570 ps duration is shown with dashed lines;

FIG. 3 show examples of the laser characteristics of the system of FIG. 1A with a cavity resonance bandwidth of 150 MHz: FIG. 3A: real-time temporal trace of the pulse train with RMS noise of 2.2%; FIG. 3B: radio-frequency (RF) spectrum of the mode-locked laser, showing clear and narrow peaks at the repetition rate of the laser (9.06 MHz);

FIG. 3C: temporal profile of the emitted pulses (10 pulses superimposed in blue) and 4.014 ns hyperbolic secant pulse fit (dashed red) obtained at the laser output and measured using an 8 GHz bandwidth real-time photodiode/oscilloscope system; and FIG. 3D: corresponding spectral profile measured with a high resolution optical spectrum analyzer (OSA) and 151 MHz hyperbolic secant pulse fit (dashed red)

DESCRIPTION OF ILLUSTRATIVE EMBODIMENTS

The present invention is illustrated in further details by the following non-limiting examples.

Figure 1A:
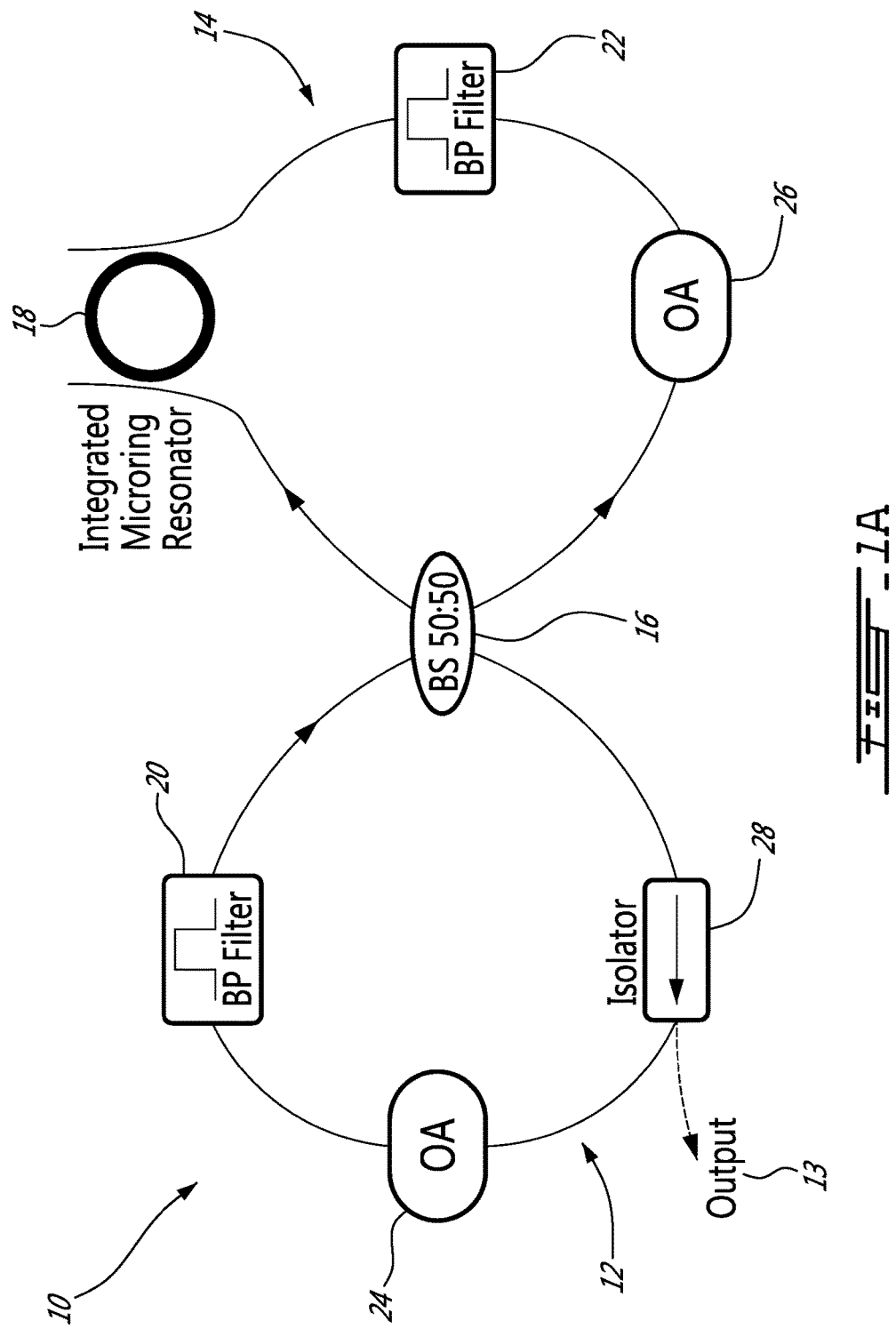
FIG. 1A is a diagrammatic view of a mode-locked laser according to an embodiment of an aspect of the present invention.

The system 10 of FIG. 1A comprises a first and a second optical loops 12, 14 coupled together by a balanced beam splitter 16, i.e. a beam splitter with a reflectivity ratio of 50:50, so as to define a figure-8 optical path in which a light beam propagating towards the beam splitter 16 in the first loop 12 is split by the beam splitter 16 to form two light beams propagating in opposite directions around the second optical loop 14.

The first loop 12 comprises an isolator 28, i.e. a direction dependent loss element for reducing the intensity of light propagating in a predetermined direction around the first loop 12, i.e. for ensuring unidirectional operation of the linear loop 12. The second loop 14 comprises a resonant nonlinear element 18, i.e. a resonator having an intensity dependent nonlinear optical transmission. Various types of resonator may be selected, such as nonlinear optical guided loops (fibered, waveguides), micro-toroid or micro-sphere resonators, nonlinear Fabry-Perot cavity, nonlinear Ikeda cavity, whispering gallery mode resonator, etc. Various elements or media with a third order nonlinearity and their combinations may be used, including for example CMOS compatible materials (silica, silicon, silicon nitride, silicon oxynitride, etc. . . . ). The resonant nonlinear element may be made in silica-based glasses, silicon, silicon nitride or diamond for example.

At least the second loop 14 comprises an optical gain element 26. A coupling element is also provided for coupling optical pulses out (see output 13 in FIG. 1) of the source [15]. Such coupling may be performed by the reflection of the isolator or using an additional a:b fiber coupler.

The beam splitter 16 and the loop 12 (left hand side of the system of FIG. 1A) form a linear unidirectional loop, providing feedback in the nonlinear amplifying loop mirror (NALM) section 14 of the laser system 10. As light propagates through the system 10, light entering the beam splitter 16 is split equally into clockwise and counterclockwise propagating beams within loop 14. Counter clockwise propagating light is first amplified before it enters the resonant nonlinear element 18, while clockwise light first passes the resonant nonlinear element 18 and is then amplified. The amplified beams return to the beam splitter 16 at the same amplitude, but one beam has acquired a nonlinear phase shift relative to the other, due to the resonant nonlinear element 18. This intensity dependent nonlinear phase shift difference between the two arms at the 50:50 beam splitter 16 enables the light splitting ratio to be controlled by the intensity, by causing the high intensity portions of the beams to be transmitted through the beam splitter 16, while the low intensity portions are reflected back in the directions the beams entered the beam splitter 16.

Thus, the intensity-dependent nonlinear phase shift difference between the two arms at the 50:50 beam splitter 16 results in an intensity dependent splitting ratio, forming a saturable absorber, which favors the transmission and subsequent amplification of the high intensity portions of the light, resulting in mode-locking of the system 10.

Bandpass filters 20, 22 are used to filter the amplified spontaneous emission (ASE) noise of optical amplifiers 24, 26 respectively, in order to select the desired resonance of the resonant nonlinear element 18. As only a small amplification is required, standard semiconductor optical amplifiers (SOA) or standard Erbium doped fiber amplifiers (EDFA) may be used as the gain element 24, 26. The bandwidth and central frequency of the selected resonance therefore intrinsically determine the central wavelength and pulse duration of the laser pulse while the total external cavity length is associated with its repetition rate.

The output 13 of the laser system can be set within the loop 12, for example by incorporating an a:b beam splitter as a coupling apparatus. This loop 12 also comprises an amplification section, with the optical amplifier 24 and a bandpass filter 20 to allow for further tuning of the laser parameters and stability, as further discussed hereinbelow. This system corresponds to a ring-cavity realization.

Figure 1B:
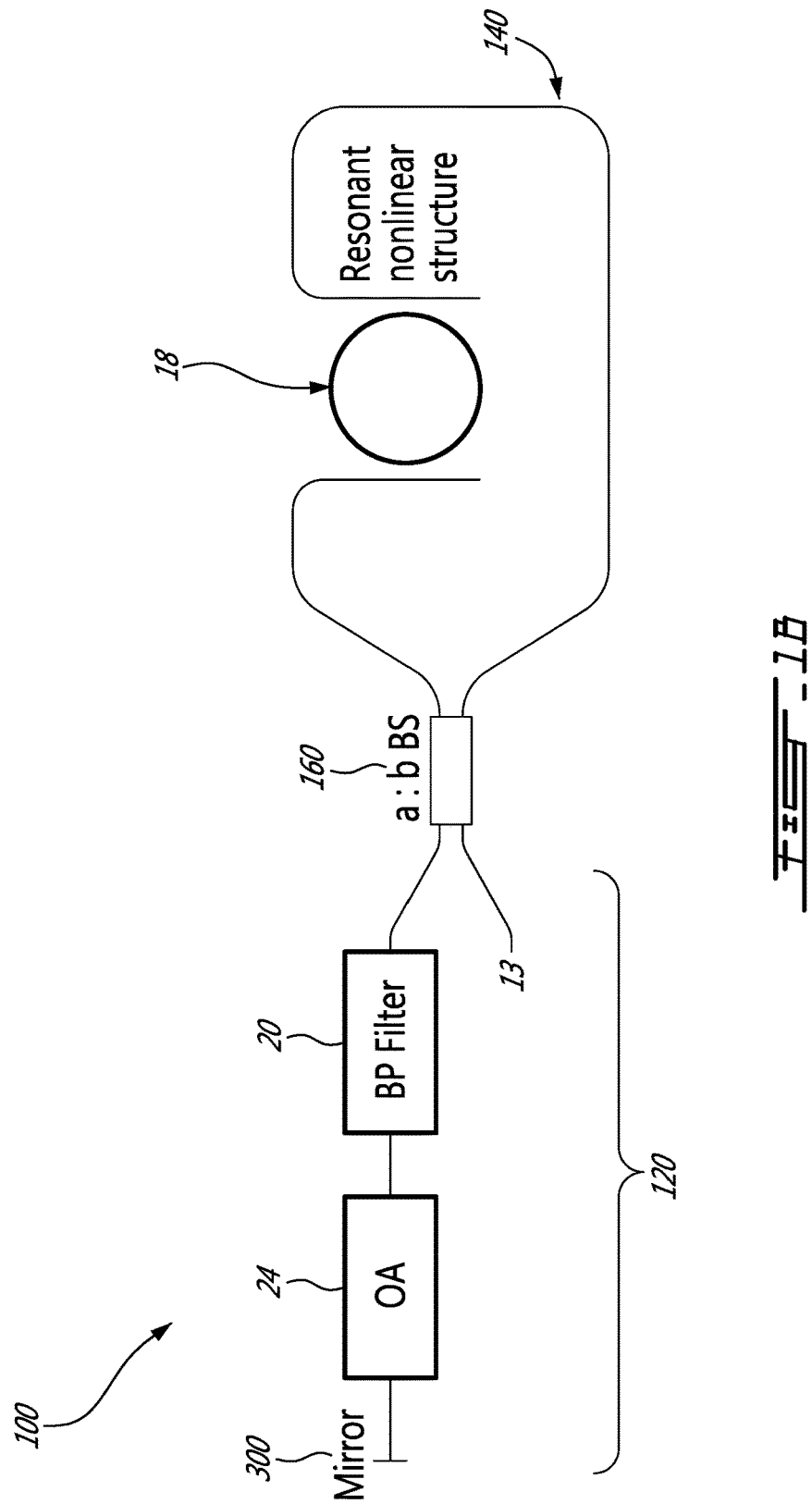
FIG. 1B is a diagrammatic view of a mode-locked laser according to an embodiment of an aspect of the present invention.
Figure 4:
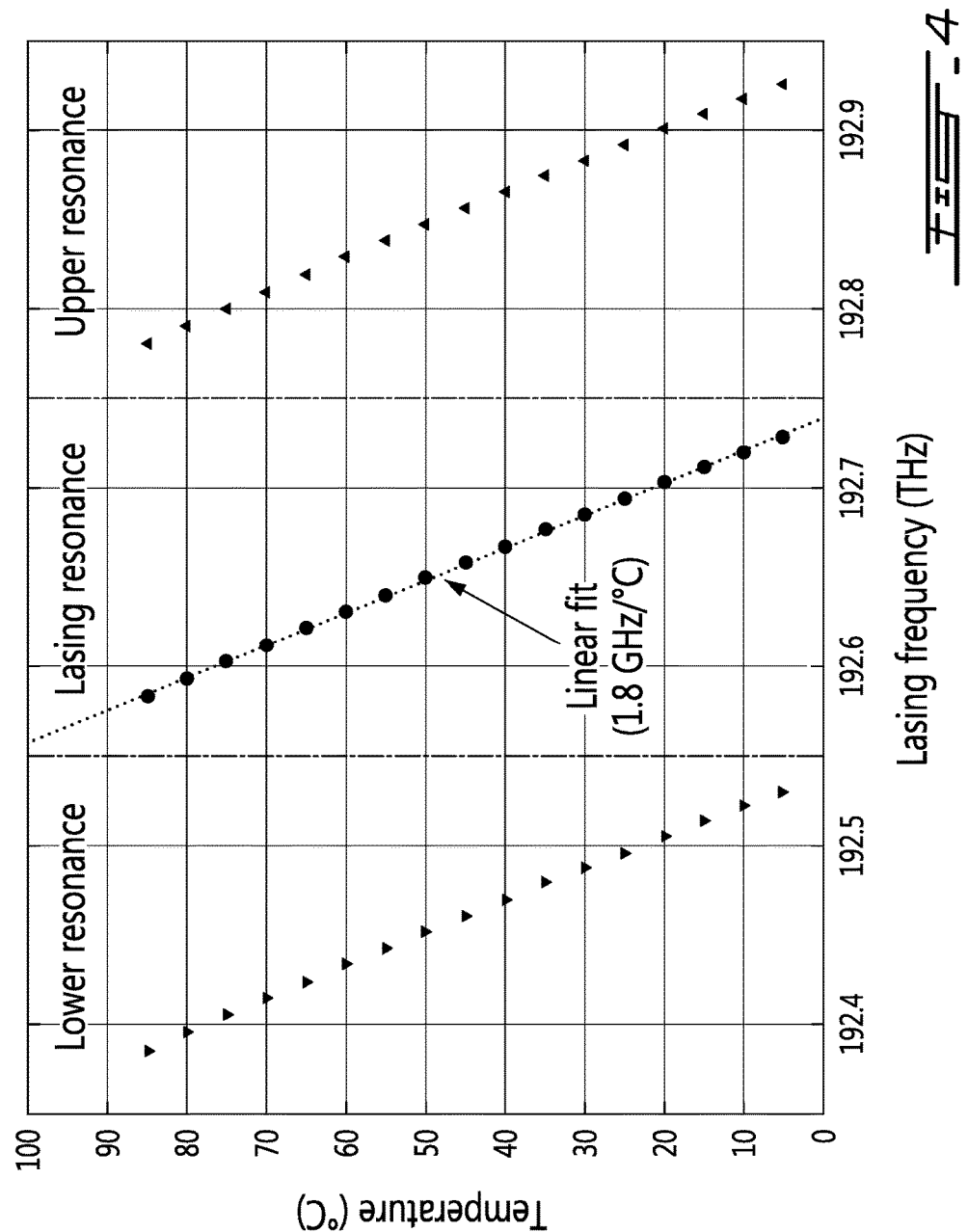
FIG. 4 shows thermal tunability where the ring resonance central frequency of the 150 MHz bandwidth resonator is adjusted by temperature control with 1.8 GHz per degree Celsius.

Another laser system 100 according to an embodiment of an aspect of the present invention is shown in FIG. 1B, based on a nonlinear optical loop mirror (NOLM) 140, in which the balanced beam splitter 16 of the system 10 of FIG. 1A is replaced by an unbalanced beam splitter 160, i.e. a beam splitter with ratio a:b different from 50:50. In this case, the difference in the splitting ratio allows for nonlinear reflection/transmission characteristics without amplification within the nonlinear loop mirror 140, thus referred to as the nonlinear optical loop mirror (NOLM). The amplification element 24 is only present in the left-hand side section 120 of the system, with an on-line mirror 300 and bandpass filter 20, to select the nonlinear resonant structure resonance. This system 100, of a Fabry-Perot design, operates without an isolator. In addition, the output 13 of this laser system 100 can be directly obtained at the unused port of the a:b beam splitter 160 or by the addition of a supplementary coupling element, such as a beam divider, in the amplification section 120.

Thus, a nonlinear optical loop (14) comprising a nonlinear resonant element (18) is coupled to an amplification section (12). The nonlinear resonant element (18) acts as both a nonlinear element and a narrow bandwidth filter for the laser system operating on a single resonance.

In a first prototype, a CMOS compatible high-Q microring resonator fabricated in high refractive index based silica glass (Hydex) [15] was used as the nonlinear resonant element 18. The resonator exhibited a measured Q-factor of 300,000 with a free spectral range of 200 GHz and an associated resonance bandwidth of 650 MHz. Two 200 GHz bandpass filters 20, 22 centered at 1556.15 nm were used to select the desired ring resonance. Due to the large field enhancement inside the resonator, a sufficient nonlinear phase-shift could be acquired on a very small footprint and at ultra-low powers (<5 mW peak power coupled into the resonant nonlinear element 18) (see FIG. 2).

The temporal trace, shown in FIG. 2A, shows a pulse train at 14.8 MHz repetition rate with an excellent stability as attested by the Radio-Frequency (RF) spectrum presented in FIG. 2B. The main pulse temporal profile (FIG. 2C) exhibits a 570 ps duration (FWHM) and is well fitted with a sech profile (dashed line). The related FWHM bandwidth of the output spectrum of such a transform-limited pulse would be 550 MHz, as indicated by the spectral shape shown in FIG. 2D (dashed line). Interestingly, even using an intrinsically very noisy amplifier (SOAs), the pulse train stability is excellent (<2% RMS) and passive mode locking could be achieved, after passing through a multi-stable regime [14], to give rise to quasi-nanosecond pulses. Additionally, due to the high nonlinearity within the cavity, it is expected, by choosing SOAs with less gain saturation power (<1 dBm), to further reduce the power-consumption, very advantageous for optical interconnects.

In a second prototype, a CMOS compatible high-Q microring resonator fabricated in high refractive index based silica glass (Hydex) [15] was used as a nonlinear resonant element 18. The resonator exhibited a measured Q-factor of 1,300,000 with a free spectral range of 200 GHz and an associated resonance bandwidth of 150 MHz. Two 200 GHz bandpass filters 20, 22 centered at 1556.15 nm were used to select the desired ring resonance. Due to the large field enhancement inside the resonator, a sufficient nonlinear phase-shift could be acquired on a very small footprint and at ultra-low powers (<5 mW peak power coupled into the resonant nonlinear element 18) (see FIG. 3).

The temporal trace, shown in FIG. 3A, shows a pulse train at 9.06 MHz repetition rate with an excellent stability as attested by the Radio-Frequency (RF) spectrum presented in FIG. 3B (with only some insignificant modulation components below −35 dB). The main pulse temporal profile (FIG. 3C) exhibits a 4.014 ns duration (FWHM) and is well fitted with a sech profile (dashed line). The related FWHM bandwidth of the output spectrum of such a transform-limited pulse would be only 151 MHz, as indicated by the spectral shape shown in FIG. 3D (dashed line). Considering the time-bandwidth relation, we achieve a nearly Fourier-transform-limited pulse with a record chirp parameter of $C=1.03$ (in contrast to earlier approaches having $C>350$). Interestingly, even using an intrinsically very noisy amplifier (SOAs), the pulse train stability is excellent (<2.2% RMS) and passive mode locking could be achieved, after passing through a multi-stable regime [14], to give rise to quasi-nanosecond pulses.

Thus passive mode-locking was achieved at ultra-low power and long pulses based on cavity enhanced nonlinearity from a CMOS compatible integrated microring resonator. The laser operating at a repetition rate of 14.8 MHz and 9.06 MHz and respectively emitting 570 ps and 4.014 ns pulses featured by intracavity peak powers lower than 5 mW can be potentially fully integrated. Specifically, the present laser addresses the photonic integration and sustainability required for on chip laser systems needed for a broad domain of applications in on chip signal processing and optical computing as well as quantum applications.

The system and method of the present invention provide an optical pulse source for producing mode-locked long pulses, i.e. between hundreds of ps and tens of ns, related to the selected resonance of a nonlinear resonant element, which are close to Fourier-bandwidth limited, while operating at low power levels. They address intrinsic limitations of both fiber based and bulk systems.

Specifically, the present system allows the generation of nearly bandwidth-limited picosecond-nanosecond pulses via passive mode locking in a compact, and subsequently integrated, configuration with ultra-low power consumption, i.e. for example below 10 µW optical average power.

In addition to the bistable single pulse mode-locked regime, the complex dynamics associated with this architecture gives rise to a series of rich multi-stable regimes, such as double pulses, multi pulses bunching, and chaotic regime for example.

The system can be tuned thermally on the entire C-band telecommunication, selecting the appropriate resonance of the resonant nonlinear element through filters (see for example 20, 22), and further adjustment of the resonator temperature.

The fabrication method is completely CMOS compatible, which results in significant benefits, particularly in view of a possible production and commercialization of the proposed device.

The invention thus provides a pulsed laser with a nonlinear resonant element in a nonlinear loop mirror design. Such system allows for passive mode-locking of temporal long transform-limited pulses (>100 ps) enabled by very low power pumping/amplification. This invention addresses conjointly multiple problems, up to now only independently solved, by providing a polarization maintained laser with low power consumption (intracavity average optical power <10 µW), emitting quasi Fourier-transform-limited pulses of hundreds of picoseconds to several nanoseconds duration at tens of MHz (tunable) repetition rate with low noise characteristics.

The system is based on a passive mode-locking method and can therefore address the intrinsic complexity limitations of active mode-locking methods, in terms of avoiding electro/acousto-optical elements and their intrinsic drawbacks associated with electronic signal synthesis and synchronization, while setting the base toward a fully integrated system, i.e. all the optical elements used here could be directly scaled and transposed to an on-chip CMOS compatible architecture.

The present system and method allow overcoming limitations regarding transform limited pulses, size, and power consumption, as well as pulsed pumping of a narrow bandwidth resonator with bandwidth matched pulses, by using a resonant nonlinear element within a NALM. The use of such a resonator (polarization maintaining) within the cavity offers a significant nonlinear cavity enhancement thus reducing the amount of power required to achieve mode-locking by nonlinear phase shift, while shortening the length of the nonlinear device. As the resonator is part of the pump laser itself, the pulses are intrinsically bandwidth matched to the resonance. This enables optimum power coupling without the need to lock the resonance to an external pump laser.

The present laser system thus comprises an embedded nonlinear resonant element to achieve passive mode-locking of long pulses, i.e. between about 0.1 and 10 ns, as a figure-8 nonlinear amplifying loop mirror (NALM) laser system with an unidirectional amplifying feedback loop, ring-cavity realization as illustrated for example in FIG. 1A, and as an unbalanced nonlinear optical loop mirror (NOLM) laser system with an amplifying on-line mirror section, in a Fabry-Perot cavity realization as illustrated for example in FIG. 1B.

The system requires ultra-low power and can thus be implemented with very low-gain/weakly-amplifying components, such semiconductor optical amplifiers (SOA) or standard Erbium Doped Fiber Amplifiers (EDFA) for example.

The system allows to achieve passive mode-locking of long pulses (0.1-10 ns), providing nearly Fourier-transform-limited pulses with a record chirp parameter of $C=1.03$. The system addresses intrinsic limitation of previously existing laser systems, namely a narrow bandwidth (hundred MHz range) passively mode-locked operation.

The system enabling the generation of passively mode-locked, nearly Fourier-transform-limited long pulses (0.1-10 ns), can be fully polarization maintaining, allowing an environmentally stable operation with a RMS inferior to 2%.

The system enabling the generation of passively mode-locked, nearly Fourier-transform-limited long pulses (0.1-10 ns), can be tuned thermally on the entire C-band telecommunication range.

The system enables optimum power coupling without the need to lock the resonance to an external pump laser.

The scope of the claims should not be limited by the preferred embodiments set forth in the examples, but should be given the broadest interpretation consistent with the description as a whole.

REFERENCES

[1] C. Young-Kai et al., "Monolithic colliding-pulse mode-locked quantum-well lasers," *Quant. Electr., IEEE Journal* 0(28, 2176-2185 (1992).
[2] A. A. Tager et al. "Mode competition and mode locking in compound cavity semiconductor lasers," *Photonics Tech. Lett., IEEE* 6, 164-166 (1994).
[3] E. P. Ippen, "Principles of passive mode locking," *Appl. Phys. B* 58, 159-170 (1994).
[4] D. J. Richardson et al., "Selfstarting, passively modelocked erbium fiber laser based on the amplifying sagnac switch," *Electron. Lett.* 27, 542-544 (1991).
[5] I. N. Duling III, "Subpicosecond all-fiber erbium laser," *Electron. Lett.* 27, 544-545 (1991).
[6] V. J. Matsas et al., "Selfstarting passively mode-locked fiber ring soliton laser exploring nonlinear polarization rotation," *Electron. Lett.* 28, 1391-1393 (1992).
[7] X. Yang et al., "Sub-picosecond pulse generation employing an SOA-based nonlinear polarization switch in a ring cavity," *Opt. Express* 12, 2448 (2004).
[8] D. E. Spence et al., "60-fsec pulse generation from a self-mode-locked Ti:sapphire laser," *Opt. Lett.* 16, 4244 (1991).
[9] HA Haus et al., "Additive-pulse modelocking in fiber lasers," *Quant. Electron., IEEE J. of* 30, 200-208 (1994).
[10] M. Peccianti et al., "Demonstration of a stable ultrafast laser based on a nonlinear microcavity," *Nat. Commun.* 3, 765 (2012).
[11] S. Min et al., "Semiconductor optical amplifier based high duty-cycle, self-starting FIG.-eight 1.7 GHz laser source," *Opt. Express* 17, 6187 (2009).
[12] Y. H. Zhong et al., "Passively mode-locked fiber laser based on nonlinear optical loop mirror with semiconductor optical amplifier," *Laser Phys.* 20, 1756 (2010).
[13] J. Y. Wang et al., "Generation of optical waveforms in 1.3-~m SOA-based fiber laser," *Laser Phys.* 22, 216 (2012).
[14] A. B. Grudinin et al., "Energy quantization in FIG. eight fiber laser," *Electron. Lett.* 28, 67-68 (1992); J. M. Soto-Crespo, N. Akhmediev "Soliton as strange attractor: nonlinear synchronization and chaos," *Phys. Rev. Lett.* 95, 024101 (2005); D. Y. Tang et al., "Mechanism of multisoliton formation and soliton energy quantization in passively mode-locked fiber lasers," *Phys. Rev. A* 72, 043816 (2005); A. Komarov et al., "Multistability and hysteresis phenomena in passively mode-locked fiber lasers," *Phys. Rev. A* 71, 053809 (2005).
[15] U.S. Pat. No. 5,050,183.

The invention claimed is:

1. A passive mode-locked laser system, comprising:
 a nonlinear optical loop comprising a resonant nonlinear element;
 an amplification section; and
 an output coupler coupling optical pulses out of the laser system;
 wherein said nonlinear optical loop and said amplification section are coupled together by a beam splitter, said beam splitter splitting a light beam from said amplification section into light beams propagating in opposite directions around said nonlinear optical loop; said resonant nonlinear element acting as both a nonlinear element and a narrow bandwidth filter for the laser system, allowing mode-locking operation of the system on a single resonance of the resonant nonlinear element.

2. The laser system of claim 1, wherein said resonant nonlinear element is a third-order nonlinear material.

3. The laser system of claim 1, wherein said resonant nonlinear element is one of: a nonlinear optical guided loop, a micro-toroid resonator, a micro-sphere resonator, a nonlinear Fabry-Perot cavity, a nonlinear Ikeda cavity, and a whispering gallery mode resonator.

4. The laser system of claim 1, wherein said resonant nonlinear element is made in one of: silica-based glasses, silicon, silicon nitride and diamond.

5. The laser system of any one of claim 1, wherein said beam splitter is a balanced beam splitter and said nonlinear optical loop operates as a nonlinear amplifying loop mirror.

6. The laser system of any one of claim 1, wherein said beam splitter is a balanced beam splitter and said nonlinear optical loop comprises an optical gain element, a first one of said light beams propagating in opposite directions being first amplified by said optical gain element before entering said resonant nonlinear element, while a second one of said light beams propagating in opposite directions first passes said resonant nonlinear element and is then amplified by said optical gain element, said light beams propagating in opposite directions returning to said balanced beam splitter with a same amplitude and a nonlinear phase shift relative to one another, high intensity portions of said beams hitting said beam splitter being transmitting through said balanced beam splitter to said amplification section.

7. The laser system of claim 1, wherein said beam splitter is a balanced beam splitter and said nonlinear optical loop comprises an optical gain element, a first one of said light beams propagating in opposite directions being first amplified by said optical gain element before entering said resonant nonlinear element, while a second one of said light beams propagating in opposite directions first passes said resonant nonlinear element and is then amplified by said optical gain element, said light beams propagating in opposite directions returning to said balanced beam splitter with a same amplitude and a nonlinear phase shift relative to one another, high intensity portions of said beams hitting said beam splitter being transmitting through said balanced beam splitter to said amplification section; and said amplification section is a unidirectional loop and comprises an optical gain element.

8. The laser system of claim 1, wherein said amplification section comprises a first optical gain element, said nonlinear optical loop comprises a second optical gain element, a first one said light beams propagating in opposite directions being first amplified by said second optical gain element before entering said resonant nonlinear element, while a second one of said light beams propagating in opposite directions first passes said resonant nonlinear element and is then amplified by said second optical gain element, said light beams propagating in opposite directions returning to said balanced beam splitter with a same amplitude and a nonlinear phase shift relative to one another, high intensity portions of said light beams hitting said balanced beam splitter being transmitting through said balanced beam splitter to said amplification section.

9. The laser system of claim 1, wherein said amplification section comprises a first optical gain element, said nonlinear optical loop comprises a second optical gain element, a first one said light beams propagating in opposite directions being first amplified by said second optical gain element before entering said resonant nonlinear element, while a second one of said light beams propagating in opposite directions first passes said resonant nonlinear element and is then amplified by said second optical gain element, said light beams propagating in opposite directions returning to said balanced beam splitter with a same amplitude and a nonlinear phase shift relative to one another, high intensity portions of said light beams hitting said balanced beam splitter being transmitting through said balanced beam splitter to said amplification section, and said first and second optical gain media are ones of: semiconductor optical amplifiers and Erbium doped fiber amplifiers.

10. The laser system of claim 1, wherein said beam splitter is a balanced beam splitter, said amplification section comprises a first optical gain element and a first bandpass filter, said nonlinear optical loop comprises a second optical gain element and a second bandpass filter, a first one of said light beams propagating in opposite directions being first amplified by said second optical gain element before entering said resonant nonlinear element, while a second one of said light beams propagating in opposite directions first passes said resonant nonlinear element and is then amplified by said second optical gain element, said light beams propagating in opposite directions returning to said balanced beam splitter with a same amplitude and a nonlinear phase shift relative to one another, high intensity portions of said light beams propagating in opposite directions hitting said balanced beam splitter being transmitting through said balanced beam splitter to said amplification section, said first and second bandpass filters selecting a single resonance of said nonlinear resonant element and filtering noise of said first and second optical gain media respectively.

11. The laser system of claim 1, wherein said output coupler is a beam splitter incorporated in said amplification section.

12. The laser system of claim 1, wherein said beam splitter is an unbalanced beam splitter and said nonlinear optical loop operates as a nonlinear optical loop mirror.

13. The laser system of claim 1, wherein said beam splitter is an unbalanced beam splitter and said nonlinear optical loop operates as a nonlinear optical loop mirror, and said amplification section comprises an optical gain element and a mirror.

14. The laser system of claim 1, wherein said beam splitter is an unbalanced beam splitter and said nonlinear optical loop operates as a nonlinear optical loop mirror, and said output coupler is an unused port of said unbalanced beam splitter.

15. The laser system of claim 1, wherein said beam splitter is an unbalanced beam splitter and said nonlinear optical loop operates as a nonlinear optical loop mirror, and said output coupler is a coupling element in said amplification section.

16. A source of mode-locked pulses in a range between 0.1 ns and 10 ns, comprising a nonlinear resonant element embedded in a nonlinear optical loop coupled to an amplification section by one of: i) a balanced beam splitter and ii) an unbalanced beam splitter; wherein the nonlinear optical loop operates as one of: i) a nonlinear amplifying loop mirror and ii) an unbalanced nonlinear optical loop mirror, respectively.

17. A passive mode-locking method, comprising embedding a nonlinear resonant element in a nonlinear optical loop, selecting one of: i) a balanced beam splitter and ii) an unbalanced beam splitter; and coupling the nonlinear optical loop with an amplification section by the selected beam splitter; whereby, i) when the selected beam splitter is the balanced beam splitter, the nonlinear optical loop operates as a nonlinear amplifying loop mirror; and ii) when the selected beam splitter is the unbalanced beam splitter, the nonlinear optical loop operates as a nonlinear optical loop mirror.

18. The method of claim 17, whereby, i) when the selected beam splitter is the balanced beam splitter, the beam splitter splits a light beam from the amplification section into light beams propagating in opposite directions around the nonlinear optical loop, a first one of the light beams propagating in opposite directions being first amplified by an optical gain element before entering the resonant nonlinear element, while a second one of the light beams first passes the resonant nonlinear element and is then amplified by the optical gain element, the light beams once amplified returning to the balanced beam splitter with a same amplitude and a nonlinear phase shift relative to one another, high intensity portions of the light beams hitting the balanced beam splitter being transmitted through the balanced beam splitter to the amplification section.

19. The method of claim 17, wherein the amplification section comprising a mirror and optical gain element.

* * * * *